United States Patent
Wang et al.

(10) Patent No.: US 10,388,650 B2
(45) Date of Patent: Aug. 20, 2019

(54) SEMI-FLOATING-GATE POWER DEVICE AND MANUFACTURING METHOD THEREFOR

(71) Applicant: FUDAN UNIVERSITY, Shanghai (CN)

(72) Inventors: Pengfei Wang, Shanghai (CN); Xiaoyong Liu, Shanghai (CN)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 15/129,958

(22) PCT Filed: Apr. 22, 2015

(86) PCT No.: PCT/CN2015/077144
§ 371 (c)(1),
(2) Date: Sep. 28, 2016

(87) PCT Pub. No.: WO2016/026322
PCT Pub. Date: Feb. 25, 2016

(65) Prior Publication Data
US 2017/0179115 A1    Jun. 22, 2017

(30) Foreign Application Priority Data

Aug. 17, 2014  (CN) .......................... 2014 1 0402668
Aug. 17, 2014  (CN) .......................... 2014 1 0403932

(51) Int. Cl.
*H01L 31/0256*     (2006.01)
*H01L 27/07*       (2006.01)
(Continued)

(52) U.S. Cl.
CPC ...... *H01L 27/0727* (2013.01); *H01L 27/0605* (2013.01); *H01L 29/42324* (2013.01);
(Continued)

(58) Field of Classification Search
CPC ..................... H01L 27/0605; H01L 29/42324
See application file for complete search history.

(56) References Cited

U.S. PATENT DOCUMENTS

2007/0187718 A1*  8/2007  Suzuki ............. H01L 29/66462
                                                            257/194

FOREIGN PATENT DOCUMENTS

CN         103594059 A      2/2014
CN         103681767 A      3/2014
(Continued)

OTHER PUBLICATIONS

International Search Report & Written Opinion dated Jul. 29, 2015 from corresponding International PCT Application No. PCT/CN2015/077144, 10 pages.

*Primary Examiner* — Samuel A Gebremariam
(74) *Attorney, Agent, or Firm* — Innovation Capital Law Group, LLP; Vic Lin

(57) ABSTRACT

The disclosure belongs to the technical field of semiconductor power devices, specifically relates to a semi-floating-gate power device, and comprises the gallium nitride high-electron-mobility transistor, the diode and the capacitor; the anode of the diode is connected with the gate of the gallium nitride high-electron-mobility transistor and the cathode of the diode is connected with the source or the channel area of the gallium nitride high-electron-mobility transistor; one end of the capacitor is connected with the gate of the gallium nitride high-electron-mobility transistor and the other end of the capacitor is connected with the external voltage signal. The semi-floating-gate power device has a simple structure, is easy to manufacture, adapts to high-voltage and high-speed operation and has very high reliability, can increase the threshold voltage of the gallium nitride high-electron-
(Continued)

mobility transistor in the working state, so that the transistor can serve as the power switch tube better.

12 Claims, 7 Drawing Sheets

(51) Int. Cl.
*H01L 27/06* (2006.01)
*H01L 29/423* (2006.01)
*H01L 29/66* (2006.01)
*H01L 29/778* (2006.01)
*H01L 49/02* (2006.01)
*H01L 29/872* (2006.01)
*H01L 21/8252* (2006.01)
*H01L 29/20* (2006.01)

(52) U.S. Cl.
CPC .. *H01L 29/42336* (2013.01); *H01L 29/66462* (2013.01); *H01L 29/7786* (2013.01); *H01L 21/8252* (2013.01); *H01L 28/40* (2013.01); *H01L 29/2003* (2013.01); *H01L 29/872* (2013.01)

(56) References Cited

FOREIGN PATENT DOCUMENTS

| | | | |
|---|---|---|---|
| CN | 104167450 A | 11/2014 | |
| CN | 104183651 A | 12/2014 | |

\* cited by examiner

SEMI-FLOATING-GATE POWER DEVICE AND MANUFACTURING METHOD THEREFOR

BACKGROUND

Technical Field

The disclosure belongs to the technical field of semiconductor power devices, particularly relates to a semi-floating-gate power device and a manufacturing method thereof.

Prior Art

Compared with a traditional silicon device, a wide bandgap device with high electron mobility, such as a gallium nitride high-electron-mobility transistor, has the advantages of high temperature resistance, high efficiency, high speed and the like, and has been widely used. Currently, a 600V gallium nitride high-electron-mobility device is difficult to be manufactured into a normally off type. Even if the device is manufactured into a normally off device, the threshold voltage of the device is close to 0V, and the device is easily opened by mistake. Therefore, the 600V gallium nitride power switch is usually composed of a normally on gallium nitride high-electron-mobility transistor device and a normally off silicon-based device which are connected by a common source and a common gate.

In the prior art, the circuit of the gallium nitride power switch with common source and common gate is as shown in FIG. 1, and the switch comprises a normally on gallium nitride transistor ($M_{GaN}$) and a normally off silicon-based MOS (metal-oxide-semiconductor) transistor ($M_{Si}$) which are connected by the common source and the common gate. Wherein, the silicon-based MOS transistor ($M_{Si}$) is actively controlled by a gate driver, and the gate driver generates a gate signal ($V_{GM}$). The gallium nitride transistor ($M_{GaN}$) is indirectly controlled by the silicon-based MOS transistor ($M_{Si}$), because the drain-source voltage of the silicon-based MOS transistor ($M_{Si}$) is equal to that of the gallium nitride transistor ($M_{GaN}$). The common-source and common-gate gallium nitride power switch has the advantage that the gate driver which meets existing standards can be used, so the common-source and common-gate gallium nitride power switch can directly replace a silicon-based MOS transistor switch. However, the common-source and common-gate gallium nitride power switch comprises the normally on gallium nitride transistor ($M_{GaN}$) and the normally off silicon-based MOS transistor ($M_{Si}$), has a complicated structure and has low reliability. Firstly, in case of the dynamic avalanche of the common-source and common-gate gallium nitride power switch, the low-voltage normally off silicon-based MOS transistor is easily broken down; secondly, because the gallium nitride transistor has voltage pulse in dynamic operation, the transistor also has the problems of breakdown, reverse connection of pn junction of gate, etc.

BRIEF SUMMARY

The purpose of the disclosure is to provide the semi-floating-gate power device which can simplify the structure of the gallium nitride power device and improve the reliability thereof.

The purpose of the disclosure is realized through the following technical scheme:

The semi-floating-gate power device comprises the gallium nitride high-electron-mobility transistor, and:

A diode whose anode is connected with the gate of the gallium nitride high-electron-mobility transistor and whose cathode is connected with the source or the channel area of the gallium nitride high-electron-mobility transistor;

A capacitor whose one end is connected with the gate of the gallium nitride high-electron-mobility transistor and whose other end is connected with an external voltage signal.

Preferably, the diode of the semi-floating-gate power device is a Schottky diode.

The disclosure also provides the specific structures of five preferable semi-floating-gate power devices with the Schottky diode:

First structure: The semi-floating-gate power device comprises a semiconductor substrate. A gallium nitride barrier layer is arranged on the semiconductor substrate, a gallium nitride channel layer is arranged on the gallium nitride barrier layer, and a gallium nitride aluminum isolation layer is arranged on the gallium nitride channel layer; a gate dielectric layer is arranged on the gallium nitride aluminum isolation layer, a floating gate is arranged on the gate dielectric layer, an interlayer dielectric layer is arranged on the floating gate, a control gate is arranged on the interlayer dielectric layer, the control gate acts on the floating gate through capacitive coupling effect, and both sides of the control gate are respectively provided with a source and a drain which are arranged on the gallium nitride channel layer; the floating gate extends to one side of the source, is beyond the gate dielectric layer, and is connected with the gallium nitride aluminum isolation layer.

Second structure: The semi-floating-gate power device comprises a semiconductor substrate. A gallium nitride barrier layer is arranged on the semiconductor substrate, a gallium nitride channel layer is arranged on the gallium nitride barrier layer, and a gallium nitride aluminum isolation layer is arranged on the gallium nitride channel layer; a gate dielectric layer is arranged on the gallium nitride aluminum isolation layer, a floating gate is arranged on the gate dielectric layer, an interlayer dielectric layer is arranged on the floating gate, a control gate is arranged on the interlayer dielectric layer, the control gate acts on the floating gate through capacitive coupling effect, and both sides of the control gate are respectively provided with a source and a drain which are arranged on the gallium nitride channel layer; the floating gate extends to one side of the source, is beyond the gate dielectric layer and the gallium nitride aluminum isolation layer, and is connected with the gallium nitride aluminum isolation layer.

Third structure: The semi-floating-gate power device comprises a semiconductor substrate. A gallium nitride barrier layer is arranged on the semiconductor substrate, a gallium nitride channel layer is arranged on the gallium nitride barrier layer, and a gallium nitride aluminum isolation layer is arranged on the gallium nitride channel layer; a gate dielectric layer is arranged on the gallium nitride aluminum isolation layer, a floating gate is arranged on the gate dielectric layer, an interlayer dielectric layer is arranged on the floating gate, a control gate is arranged on the interlayer dielectric layer, the control gate acts on the floating gate through capacitive coupling effect, and both sides of the control gate are respectively provided with a source and a drain which are arranged on the gallium nitride channel layer; the floating gate is connected with the gallium nitride channel layer through the first openings of the gate dielectric layer and the gallium nitride aluminum isolation layer.

Fourth structure: The semi-floating-gate power device comprises a semiconductor substrate. A gallium nitride barrier layer is arranged on the semiconductor substrate, a gallium nitride channel layer is arranged on the gallium nitride barrier layer, and a gallium nitride aluminum isolation layer is arranged on the gallium nitride channel layer; a gate dielectric layer is arranged on the gallium nitride aluminum isolation layer, a floating gate is arranged on the gate dielectric layer, an interlayer dielectric layer is arranged on the floating gate, a control gate is arranged on the interlayer dielectric layer, the control gate acts on the floating gate through capacitive coupling effect, and both sides of the control gate are respectively provided with a source and a drain which are arranged on the gallium nitride channel layer; the first openings are formed in the gate dielectric layer and the gallium nitride aluminum isolation layer below the floating gate, a first groove is formed in the gallium nitride channel layer below the first opening, the bottom of the first groove is within any depth of the gallium nitride channel layer or extends to the bottom of the gallium nitride channel layer, and the floating gate fully fills the first groove.

Fifth structure: The semi-floating-gate power device comprises a semiconductor substrate. A gallium nitride barrier layer is arranged on the semiconductor substrate, a gallium nitride channel layer is arranged on the gallium nitride barrier layer, and a gallium nitride aluminum isolation layer is arranged on the gallium nitride channel layer; a gate dielectric layer is arranged on the gallium nitride aluminum isolation layer, a floating gate is arranged on the gate dielectric layer, an interlayer dielectric layer is arranged on the floating gate, a control gate is arranged on the interlayer dielectric layer, the control gate acts on the floating gate through capacitive coupling effect, and both sides of the control gate are respectively provided with a source and a drain which are arranged on the gallium nitride channel layer; the first openings are formed in the gate dielectric layer and the gallium nitride aluminum isolation layer below the floating gate, a second opening is formed in the gallium nitride aluminum isolation layer below the floating gate; a first groove and a second groove are respectively formed in the gallium nitride channel layer below the first openings and the second opening; the bottoms of the first and the second grooves are within any depth of the gallium nitride channel layer or extend to the bottom of the gallium nitride channel layer, the second groove is close to one side of the drain and the depth thereof is the same with that of the first groove, the gate dielectric layer covers the inner surface of the second groove and exposes the first groove, and the floating gate fully fills the first and the second grooves.

Preferably, in the above five semi-floating-gate power devices, the gallium nitride aluminum barrier layer can be also arranged between the gallium nitride barrier layer and the gallium nitride channel layer.

Preferably, in the above five semi-floating-gate power devices, the floating gate is made of chromium, an alloy including nickel or tungsten, or doped polysilicon; the interlayer dielectric layer is made of one or more types of silicon dioxide, silicon nitride or silicon oxynitride; the control gate is a polysilicon gate or a metal control gate.

The manufacturing method of the semi-floating-gate power device based on the above fifth structure comprises the step of sequentially forming the gallium nitride barrier layer, the gallium nitride channel layer and the gallium nitride aluminum isolation layer on the provided semiconductor substrate;

The method also comprises the following steps:

Photoetching and etching, and forming the first and the second grooves in the gallium nitride channel layer;

Depositing the gate dielectric layer, photoetching and etching, forming a floating gate opening in the gate dielectric layer, and the floating gate opening exposes the first groove;

Covering the above formed structure and depositing a first layer of conductive film;

Forming a first layer of insulating film on the first layer of conductive film;

Forming a second layer of conductive film on the first layer of insulating film;

Photoetching and sequentially etching the second layer of conductive film, a second layer of insulating film and the first layer of conductive film, and forming floating gates which cover the first and the second grooves, and the interlayer dielectric layer and the control gate on the floating gate;

Both sides of the control gate are respectively formed on the source and the drain which are contacted the gallium nitride aluminum isolation layer or the gallium nitride channel layer.

The working principle of the semi-floating-gate power device is as follows: The gate of the gallium nitride high-electron-mobility transistor is connected with the source or the channel area through the diode, the gate of the gallium nitride high-electron-mobility transistor becomes a semi-floating-gate structure through a diode clamp, and if the gallium nitride high-electron-mobility transistor is a normally on transistor, the semiconductor power device is in an initial state, i.e. is connected. Meanwhile, because the external voltage signal ($V_{CG}$) acts on a semi-floating gate through the capacitor, the external voltage signal is positive voltage and the device is on, negative charge is charged into the semi-floating gate, so that the threshold voltage rises; when the external voltage signal is turned to 0V from positive, the voltage of the semi-floating gate is negative (the time is calculated by nanosecond), and the semi-floating-gate power device is stopped. When the external voltage signal turns to 0V from positive again, the semi-floating-gate power device is connected again. As a result, the semi-floating-gate power device is on and off sequentially by adjusting the pulse of the external voltage signal ($V_{CG}$), to form a switch power circuit or other circuits.

If the gallium nitride high-electron-mobility transistor is a normally off transistor, the semi-floating-gate power device is in the initial state, i.e. is off. Because the external voltage signal ($V_{CG}$) acts on a semi-floating gate through the capacitor, the external voltage signal is positive voltage, negative charge is charged into the semi-floating gate, so that the threshold voltage of the device rises; when the external voltage signal is turned to 0V from positive, the voltage of the semi-floating gate is negative (the time is calculated by nanosecond), and the semi-floating-gate power device is stopped. When the external voltage signal turns to 0V from positive again, the semi-floating-gate power device is connected again. As a result, the semi-floating-gate power device is on and off sequentially by adjusting the pulse of the external voltage signal ($V_{CG}$), to form a switch power circuit or other circuits.

Compared with the prior art, the disclosure has the significant advantages that: First, the semi-floating-gate power device is of the semi-floating-gate structure, the control gate is formed on the semi-floating gate, the control gate acts on the semi-floating gate through the capacitive coupling effect, so that one semi-floating-gate power device can realize the functions of two transistors which are connected by the common source and the common gate, and the structure of the semiconductor power device is simplified. Secondly, the embedded diode between the gate of the gallium nitride high-electron-mobility transistor and the source or the channel area can be clamped and the external voltage signal can control the instant on of the semi-floating-gate power device by capacitive induction, so that the semi-floating-gate power device adapts to high-voltage and high-speed operation and has very high reliability. Finally, a semi-floating-gate device structure with the power can increase the threshold voltage of the gallium nitride high-electron-mobility transistor in the working state, so that the transistor can serve as the power switch tube better.

BRIEF DESCRIPTION OF THE FIGS.

DETAILED DESCRIPTION

In order to more clearly describe the specific embodiment of the disclosure, FIGS. in the Specification magnify the thickness of layers and areas in the disclosure, and the sizes of the listed FIGS. do not represent the actual sizes; the FIGS. are schematic, and shall not limit the scope of the disclosure. The examples as listed in the Specification shall not be only limited to specific shapes of areas as shown in the FIGS. but shall comprise shapes worked out, such as the deviation caused in manufacturing; moreover, for example, a curve obtained in etching is usually has the characteristics of being bent or round, the curve is expressed in a rectangular shape in the examples of the disclosure. Meanwhile, in the following description, the term substrate can be understood as a semiconductor chip in technique processing and may comprise other films which are prepared thereon.

Below is the further description of the specific embodiment by integrating the FIGS. and examples.

Figure 1:
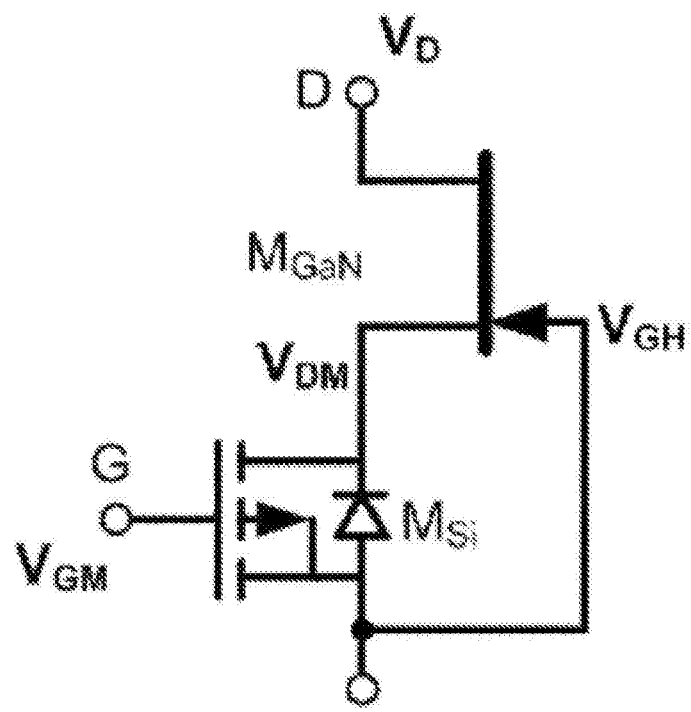
FIG. 1 is the electrical schematic diagram of a common-source and common-gate gallium nitride power switch circuit in the prior art.
Figure 2:
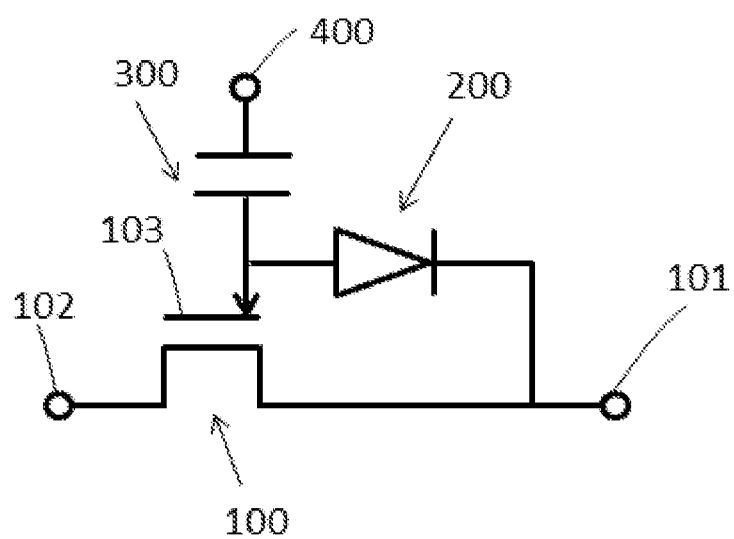
FIG. 2 is an equivalent electrical schematic diagram of an example of the semi-floating-gate power device.

FIG. 2 is an equivalent electrical schematic diagram of an example of the semi-floating-gate power device. As shown in FIG. 2, the semi-floating-gate power device comprises the gallium nitride high-electron-mobility transistor 100, and the gallium nitride high-electron-mobility transistor comprises the source 101, the gate 103 and the drain 102. The source 101 and the gate 103 of the gallium nitride high-electron-mobility transistor are connected through the diode 200, so that the gate 103 becomes the semi-floating-gate structure, i.e. the gate 103 of the gallium nitride high-electron-mobility transistor can serve as the floating gate 103 of the semi-floating-gate power device. The diode diode 200200 comprises but not limited to be the Schottky diode, the anode of the diode 200 is connected with the gate 103, and the cathode of the diode 200 is connected with the source 101. The external voltage signal ($V_{CG}$) 400 is connected with the gate 103 through the capacitor 300, so that the external voltage signal ($V_{CG}$) 400 can control the on or off of the gallium nitride high-electron-mobility transistor 100 by capacitive induction.

Optionally, in the semi-floating-gate power device, the cathode of the diode 200 does not need to be connected with the source of the gallium nitride high-electron-mobility transistor 100 but is connected with the channel area of the gallium nitride high-electron-mobility transistor 100.

The semi-floating-gate power device can be of a plurality of structures, and below are preferable examples of the semi-floating-gate power device.

Example 1

Figure 3:
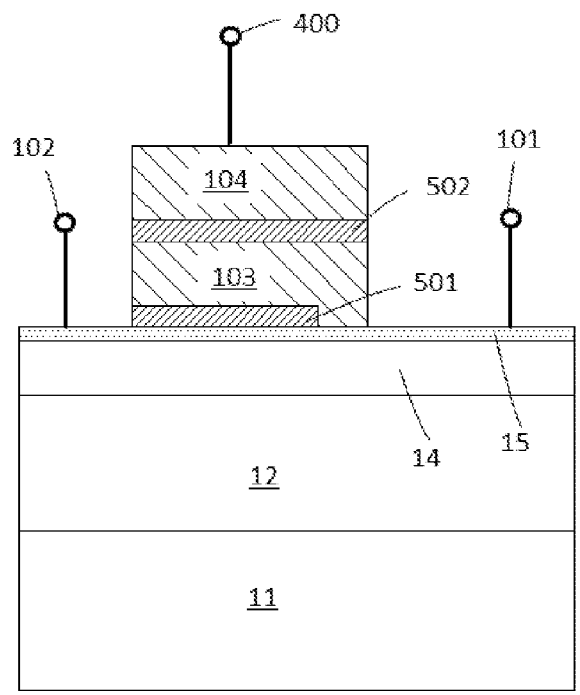
FIGS. 3-5 are the structure profile sketch of examples 1-3 of the semi-floating-gate power device.

FIG. 3 is the profile sketch of Example 1 of the semi-floating-gate power device. As shown in FIG. 3, the semi-floating-gate power device comprises the semiconductor substrate 11 and the gallium nitride barrier layer 12 on the semiconductor substrate 11, and the gallium nitride channel layer 14 and the gallium nitride aluminum isolation layer 15 are sequentially formed on the gallium nitride barrier layer 12. The gate dielectric layer 501 is formed on the gallium nitride aluminum isolation layer 15, and the gate (i.e. floating gate) 103 of the gallium nitride high-electron-mobility transistor is formed on the gate dielectric layer 501. The source 101 and the drain 102 of the gallium nitride high-electron-mobility transistor are respectively formed on both sides of the floating gate 103, and the source 101 and the drain 102 are formed on the gallium nitride aluminum isolation layer 15. The floating gate 103 extends to one side of the source 101, then is beyond the gate dielectric layer 501 and is contacted with the gallium nitride aluminum isolation layer 15. Because the floating gate 103 is usually chromium, the alloy including nickel or tungsten, or doped polysilicon, the floating gate 103 and the gallium nitride aluminum isolation layer 15 form the Schottky diode, i.e. the Schottky diode is directly formed on the gate 103 and the source 101. Usually, the wide of the Schottky diode (vertical to a paper surface) is less than that of an active area, so that the channel area of the high-electron-mobility device can be effectively connected to the source 101. The interlayer dielectric layer 502 is formed on the floating gate 103, and the interlayer dielectric layer 502 is usually silicon dioxide, silicon nitride, hafnium oxide, aluminum oxide and other high-dielectric constant media or the lamination therebetween. The control gate 104 is formed on the interlayer dielectric layer 502, the control gate 104 is connected with the external voltage signal 400 and acts on the floating gate 103 through the capacitive coupling effect.

Example 2

Figure 4:
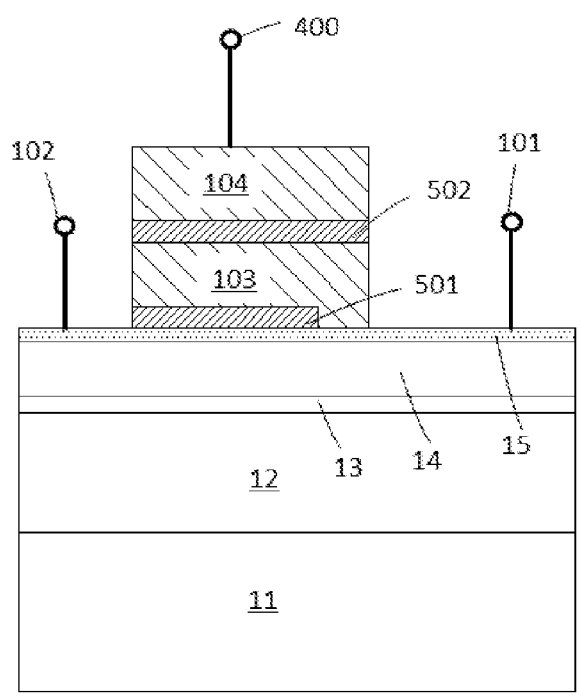

FIG. 4 is the profile sketch of Example 2 of the semi-floating-gate power device. Compared with the semi-floating-gate power device as shown in FIG. 3, the difference of the semi-floating-gate power device as shown in FIG. 4 is only that the gallium nitride aluminum barrier layer 103 is arranged between the gallium nitride barrier layer 102 and the gallium nitride channel layer 104, the structure of the gallium nitride aluminum barrier layer 103 is a commonly used structure in the high-electron-mobility transistor and will not be further described in the examples of the disclosure.

Example 3

Figure 5:
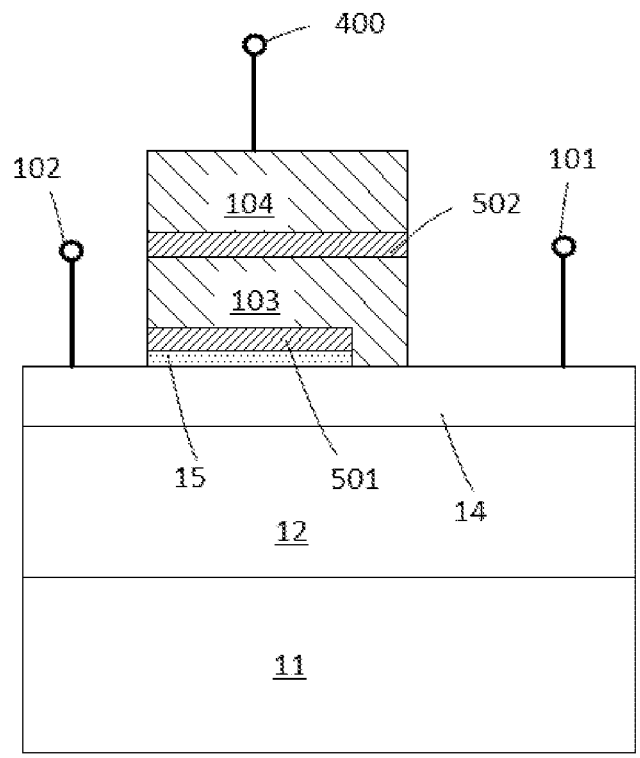

FIG. 5 is the profile sketch of Example 3 of the semi-floating-gate power device. Compared with the semi-floating-gate power device as shown in FIG. 3, the difference of the semi-floating-gate power device as shown in FIG. 5 is that the gallium nitride aluminum isolation layers 15 on both sides of the gate dielectric layer 501 are etched, so that the floating gate 103 extends to one side of the source 101, then is beyond the gate dielectric layer 501 and the gallium nitride aluminum isolation layer 15 and is contacted with the gallium nitride channel layer 14. The source 101 and the drain 102 are directly formed on the gallium nitride channel layer 14.

Figure 6:
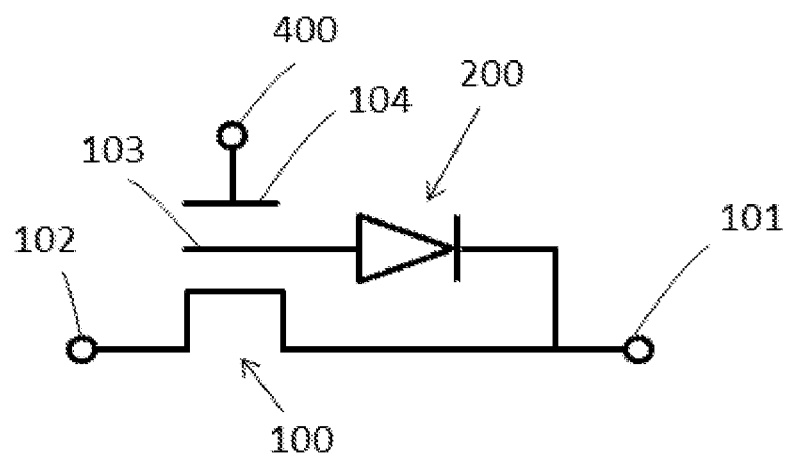
FIG. 6 is an equivalent electrical schematic diagram of the semi-floating-gate power device in the examples 1-3 as shown in FIGS. 3-5.

FIG. 6 is an equivalent electrical schematic diagram of the semi-floating-gate power device in the examples 1-3 as shown in FIGS. 3-5. As shown in FIG. 6, the semi-floating-gate power device comprises the gallium nitride high-electron-mobility transistor 100, the gate (i.e. the floating gate of the semi-floating-gate power device) of the gallium nitride high-electron-mobility transistor 100 is connected with the source 101 through the Schottky diode 200, so that the gate 103 is the semi-floating-gate structure, and the control gate 400 acts on the floating gate 103 through the capacitive coupling effect.

Example 4

Figure 7:
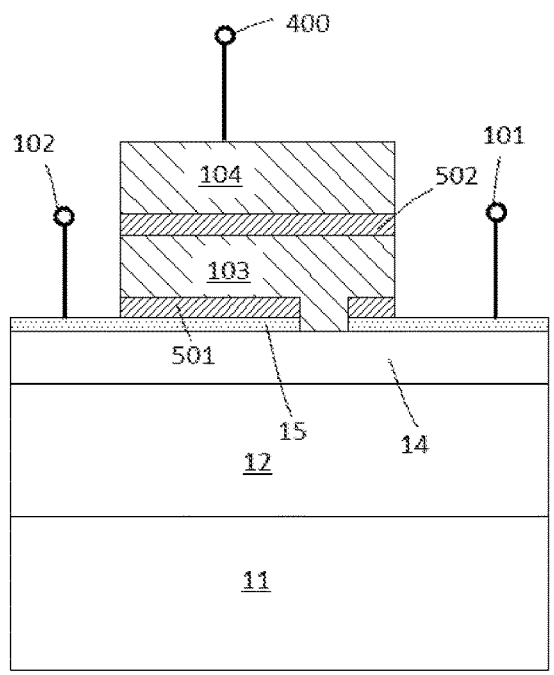
FIGS. 7-9 are equivalent structure profile sketches of the examples 4-6 of the semi-floating-gate power device.

FIG. 7 is the profile sketch of Example 4 of the semi-floating-gate power device. As shown in FIG. 7, the semi-floating-gate power device comprises the semiconductor substrate 11 and the gallium nitride barrier layer 12 on the semiconductor substrate 11, and the gallium nitride channel layer 14 and the gallium nitride aluminum isolation layer 15 are sequentially formed on the gallium nitride barrier layer 12. The gate dielectric layer 501 is formed on the gallium nitride aluminum isolation layer 15, and the gate (i.e. floating gate) 103 of the gallium nitride high-electron-mobility transistor is formed on the gate dielectric layer 501. The source 101 and the drain 102 of the gallium nitride high-electron-mobility transistor are respectively formed on both sides of the floating gate 103, and the source 101 and the drain 102 are formed on the gallium nitride channel layer 14. The floating gate 103 is contacted with the gallium nitride channel layer 14 through the first openings in the gate dielectric layer 501 and the gallium nitride aluminum isolation layer 15; because the floating gate 103 is usually chromium, the alloy including nickel or tungsten, or doped polysilicon, the floating gate 103 and the gallium nitride channel layer 14 form the Schottky diode, i.e. the Schottky diode is formed on the floating gate 103 and the channel area. Usually, the wide of the Schottky diode (vertical to a paper surface) is less than that of an active area, so that the channel area of the high-electron-mobility device can be effectively connected to the source 101. The interlayer dielectric layer 502 is formed on the floating gate 103, and the interlayer dielectric layer 502 is usually silicon dioxide, silicon nitride, hafnium oxide, aluminum oxide and other high-dielectric constant media or the lamination therebetween. The control gate 104 is formed on the interlayer dielectric layer 502, the control gate 104 is connected with the external voltage signal 400 and acts on the floating gate 103 through the capacitive coupling effect.

Example 5

Figure 8:
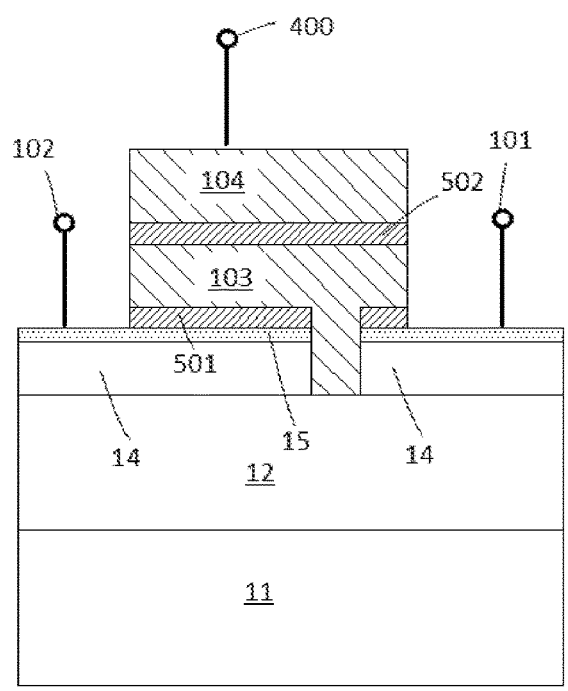

FIG. 8 is the profile sketch of Example 5 of the semi-floating-gate power device which is an optimized structure of the semi-floating-gate power device as shown in FIG. 7. The first groove is formed in the gallium nitride channel layer 14, the groove is arranged below the first openings of the gate dielectric layer 501 and the gallium nitride aluminum isolation layer 15; the bottom of the first groove is arranged at that of the gallium nitride channel layer 14, i.e. the bottom of the groove is arranged on the surface of the gallium nitride barrier layer 12, and the floating gate 103 fully fills the first groove. More optionally, the bottom of the first groove can be within any depth of the gallium nitride channel layer 14, and the connection voltage of the Schottky diode between the floating gate 103 and the gallium nitride channel layer 14 can be conveniently regulated by adjusting the depth of the first groove. The deeper the first groove is, the lower is the connection voltage; on the contrary, the shallower the first groove is, the higher is the connection voltage.

Example 6

Figure 9:
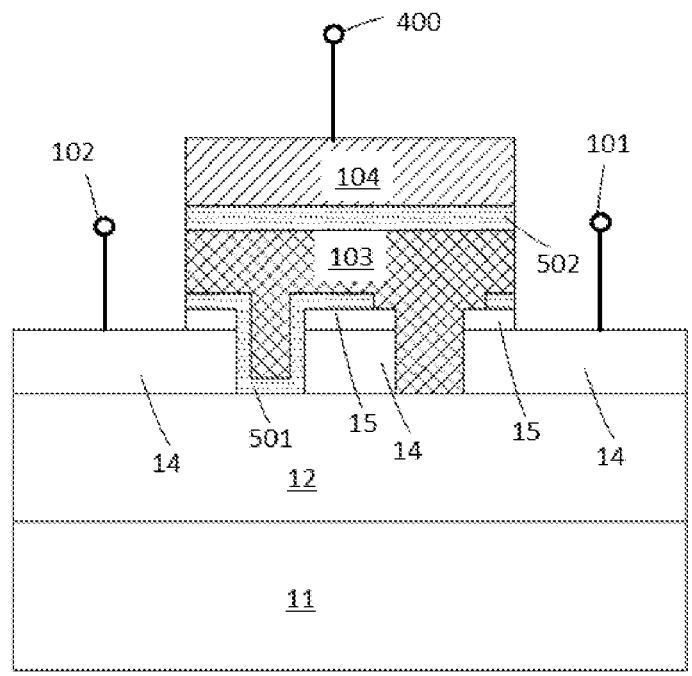

FIG. 9 is the profile sketch of Example 6 of the semi-floating-gate power device. Based on the semi-floating-gate power device as shown in FIG. 7, the second groove with the same depth of the first groove is formed in the gallium nitride channel layer 14 which is close to one side of the drain 102, the gate dielectric layer 501 covers the surface of the second groove and exposes the first groove, and the floating gate 103 fully fills the first and the second grooves at the same time.

Figure 10:
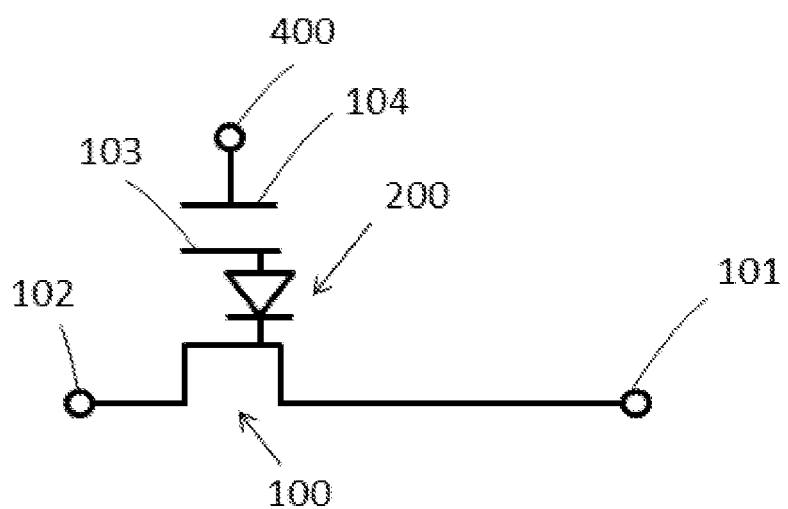
FIG. 10 is equivalent structure profile sketches of the examples 4-6 of the semi-floating-gate power device as shown in FIGS. 7-9.

FIG. 10 is equivalent structure profile sketches of semi-floating-gate power devices of the examples 4-6 as shown in FIGS. 7-9. Wherein, the gate (i.e. the floating gate of the semi-floating-gate power device) of the gallium nitride high-electron-mobility transistor 100 is connected with the channel area of the gallium nitride high-electron-mobility transistor 100 through the Schottky diode 200, so that the control gate 400 acts on the floating gate 103 through capacitive coupling effect.

FIGS. 11-14 are flowcharts of an example of the manufacturing method of the semi-floating-gate power device as shown in FIG. 9.

Figure 11:
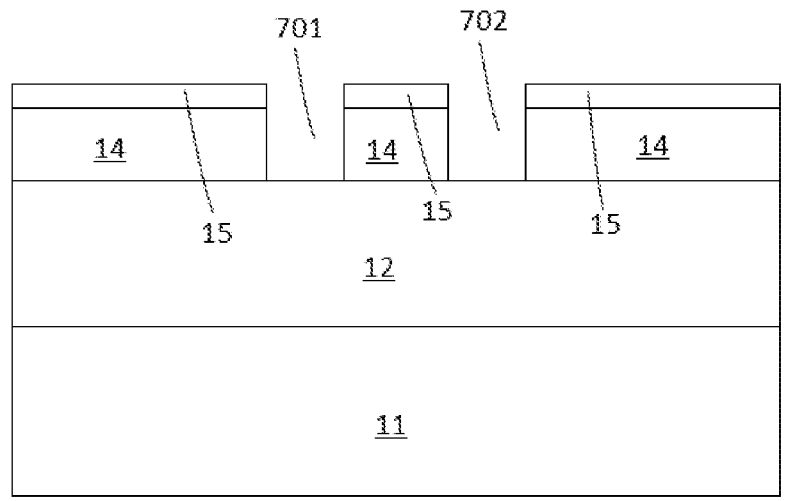
FIGS. 11-14 are flowcharts of an example of the manufacturing method of the semi-floating-gate power device.

Firstly, as shown in FIG. 11, the gallium nitride barrier layer 12, the gallium nitride channel layer 14 and the gallium nitride aluminum isolation layer 15 are sequentially deposited on the semiconductor substrate 11, then the gallium nitride aluminum isolation layer 15 and the gallium nitride channel layer 14 are photoetched and sequentially etched, and the first groove 701 and the second groove 703 are formed in the gallium nitride channel layer 14.

Figure 12:
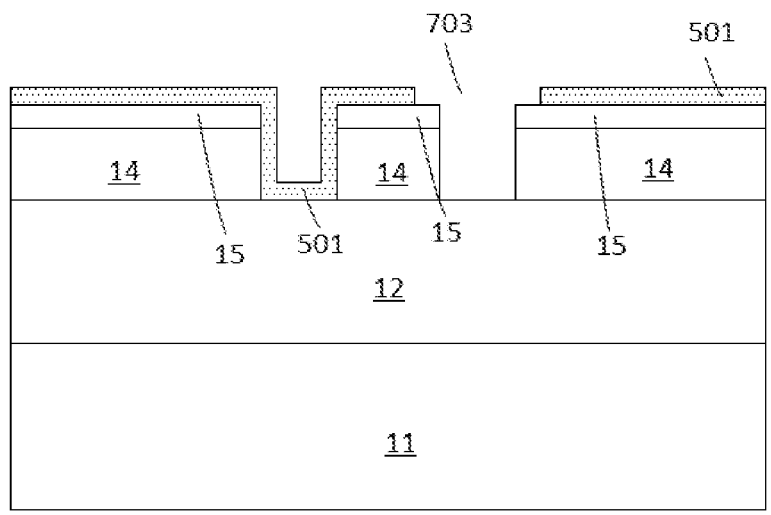

Next, as shown in FIG. 12, the above formed structure is covered, a layer of gate dielectric layer 501 is deposited, photoetched and etched, a floating gate opening 703 is formed in the gate dielectric layer 501, the opening width of the floating gate opening 703 is more than that of the second groove 702, so that the floating gate opening 703 exposes the second groove 702.

Figure 13:
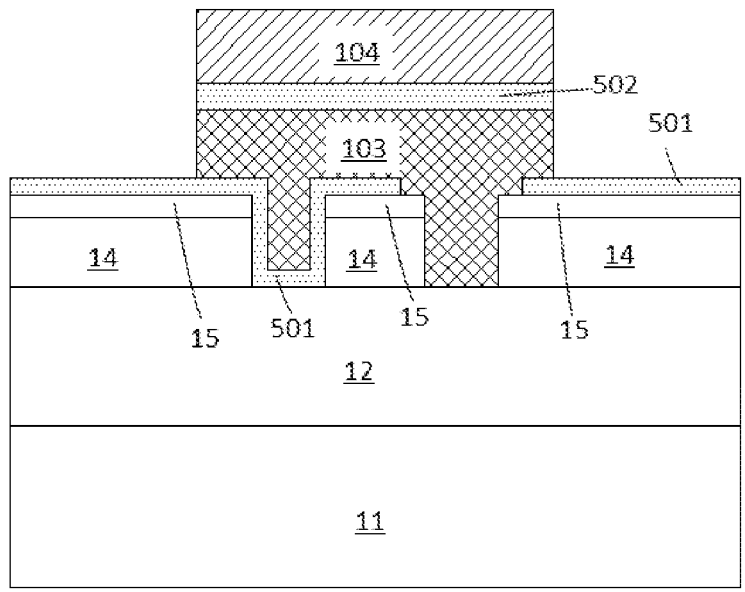

Further, as shown in FIG. 13, the above formed structure is covered, the first layer of conductive film, the first layer of insulating film and the second layer of conductive film are sequentially deposited, then the second layer of conductive film, the second layer of insulating film and the first layer of conductive film are photoetched and sequentially etched, and the floating gate 103 which covers the first and the second grooves as well as the interlayer dielectric layer 502 and the control gate 104 on the floating gate 103 are formed.

Figure 14:
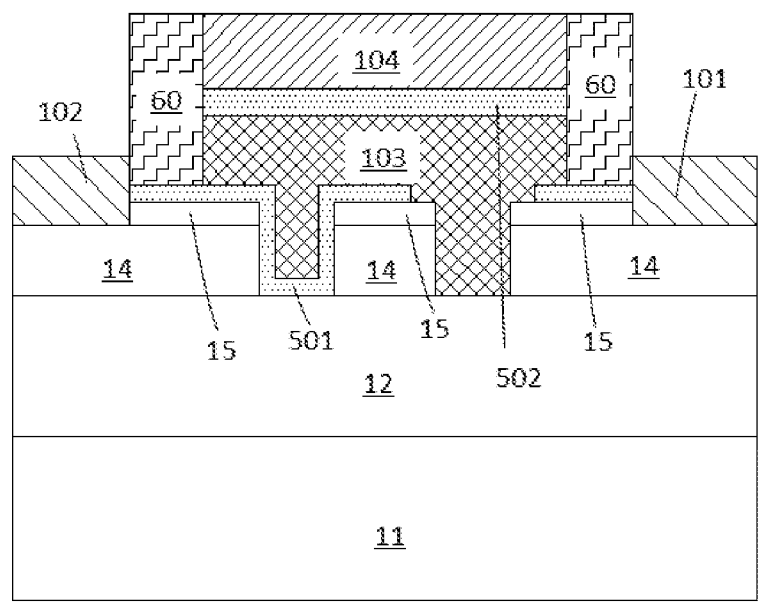

Finally, as shown in FIG. 14, gate side walls 60 are formed on both sides of the gate 104, then the exposed gate dielectric layer 501 is etched, and the source 101 and the drain 102 which are contacted with the gallium nitride channel layer 14 are respectively formed on both sides of the control gate 104 through a process which is known in the industry.

What is claimed is:

1. A semi-floating-gate power device comprising:
   a semiconductor substrate;
   a gallium nitride barrier layer arranged on the semiconductor substrate;
   a gallium nitride channel layer arranged on the gallium nitride barrier layer;
   a gallium nitride aluminum isolation layer arranged on the gallium nitride channel layer;
   a gate dielectric layer arranged on the gallium nitride aluminum isolation layer;
   a floating gate arranged on the gate dielectric layer, wherein at least a portion of the floating gate directly contacts the gallium nitride aluminum isolation layer;
   an interlayer dielectric layer arranged on the floating gate;
   a control gate arranged on the interlayer dielectric layer, the control gate acts on the floating gate through capacitive coupling effect, and both sides of the control gate are respectively provided with a source and a drain which are arranged on the gallium nitride channel layer.

2. The semi-floating-gate power device of claim 1, further comprising a gallium nitride high-electron-mobility transistor, and:
   a diode whose anode is connected with the gate of the gallium nitride high-electron-mobility transistor and whose cathode is connected with the source or the channel area of the gallium nitride high-electron-mobility transistor which is connected to the gallium nitride aluminum isolation layer;
   a capacitor whose one end is connected with the gate of the gallium nitride high-electron-mobility transistor and whose other end is connected with an external voltage signal and a control gate.

3. The semi-floating-gate power device as claimed in claim 2, wherein the diode is a Schottky diode.

4. The semi-floating-gate power device as claimed in claim 1, wherein the floating gate extends to one side of the source, is beyond the gate dielectric layer, and is connected with the gallium nitride aluminum isolation layer.

5. The semi-floating-gate power device as claimed in claim 1, wherein the floating gate extends to one side of the source, is beyond the gate dielectric layer and the gallium nitride aluminum isolation layer, and is connected with the gallium nitride aluminum isolation layer.

6. The semi-floating-gate power device as claimed in claim 1, wherein the floating gate is connected with the gallium nitride channel layer through first openings of the gate dielectric layer and the gallium nitride aluminum isolation layer.

7. The semi-floating-gate power device as claimed in claim 6, wherein a first groove is formed in the gallium nitride channel layer;
   the first groove is arranged under the first openings of the gate dielectric layer and, the bottom of the first groove is within any depth of the gallium nitride channel layer or extends to the bottom of the gallium nitride channel layer, and the floating gate fully fills the first groove.

8. The semi-floating-gate power device as claimed in claim 7, wherein a second opening is formed in the gallium nitride aluminum isolation layer; a second groove is formed in the gallium nitride channel layer below the second opening; the second groove is close to one side of the drain and the depth thereof is the same with that of the first groove; the gate dielectric layer covers the inner surface of the second groove, and the floating gate fully fills the first groove.

9. The semi-floating-gate power device as claimed in claim 1, wherein the floating gate is made of chromium, an alloy including nickel or tungsten, or doped polysilicon; the interlayer dielectric layer is made of one or more types of silicon dioxide, silicon nitride or silicon oxynitride; the control gate is a polysilicon gate or a metal control gate.

10. The semi-floating-gate power device as claimed in claim 1, wherein the floating gate extends to one side of the source, is beyond the gate dielectric layer, and is connected with the gallium nitride aluminum isolation layer.

11. The semi-floating-gate power device as claimed in claim 1, wherein the floating gate extends to one side of the source, is beyond the gate dielectric layer and the gallium nitride aluminum isolation layer, and is connected with the gallium nitride aluminum isolation layer.

12. The semi-floating-gate power device as claimed in claim 1, wherein the floating gate is connected with the gallium nitride channel layer through the first openings of the gate dielectric layer and the gallium nitride aluminum isolation layer.

* * * * *